US012701667B2

(12) United States Patent
Burger et al.

(10) Patent No.: US 12,701,667 B2
(45) Date of Patent: Aug. 4, 2026

(54) MICROWAVE DEVICE WITH NON-DESTRUCTIVE DETACHABLE CONNECTION FOR HIGH FREQUENCY APPLICATION

(71) Applicant: Rohde & Schwarz GmbH & Co. KG, Munich (DE)

(72) Inventors: Anna Katharina Burger, Munich (DE); Nico Riedmann, Munich (DE); Claus Tremmel, Munich (DE); Markus Freudenreich, Munich (DE); Sebastian Sedlmeier, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 297 days.

(21) Appl. No.: 18/428,691

(22) Filed: Jan. 31, 2024

(65) Prior Publication Data

US 2025/0247973 A1     Jul. 31, 2025

(51) Int. Cl.
*H05K 5/02* (2006.01)
*H05K 7/14* (2006.01)

(52) U.S. Cl.
CPC ......... *H05K 5/0217* (2013.01); *H05K 7/1427* (2013.01)

(58) Field of Classification Search
None
See application file for complete search history.

(56) References Cited

U.S. PATENT DOCUMENTS

| | | | | | |
|---|---|---|---|---|---|
| 3,662,318 | A | * | 5/1972 | Decuyper | .............. H01R 24/44 |
| | | | | | 333/260 |
| 3,936,778 | A | * | 2/1976 | De Ronde | ................. H01P 5/02 |
| | | | | | 333/246 |
| 4,084,250 | A | * | 4/1978 | Albertine | ............. H05K 7/1427 |
| | | | | | 361/679.48 |
| 4,455,448 | A | * | 6/1984 | Bertolina | ............. H05K 9/0056 |
| | | | | | 333/260 |
| 4,984,990 | A | * | 1/1991 | Lindahl | ................... H01P 5/085 |
| | | | | | 333/260 |

(Continued)

FOREIGN PATENT DOCUMENTS

| | | | | | |
|---|---|---|---|---|---|
| CN | 101313641 | A | * | 11/2008 | ............. H05K 5/069 |
| CN | 104995906 | B | * | 1/2018 | ............. H04N 23/54 |

(Continued)

*Primary Examiner* — Timothy J. Dole
*Assistant Examiner* — Muhammed Azam
(74) *Attorney, Agent, or Firm* — CHRISTENSEN O'CONNOR JOHNSON KINDNESS PLLC

(57) ABSTRACT

A microwave device includes a housing that encompasses a space. At least one circuit structure is accommodated in the housing. The at least one circuit structure includes a substrate and at least one integrated circuit component arranged on the substrate. An electrically conductive flexible band is provided that is attached to the substrate. The electrically conductive flexible band is electrically connected to the at least one integrated circuit component. The housing has an opening through which an inner conductor is fed so as to extend into the space encompassed by the housing. The inner conductor is electrically connected to the electrically conductive flexible band in a non-destructive detachable manner.

20 Claims, 11 Drawing Sheets

(56) References Cited

U.S. PATENT DOCUMENTS

| | | | | |
|---|---|---|---|---|
| 5,570,068 A * | 10/1996 | Quan | | H01P 5/085 |
| | | | | 333/260 |
| 7,477,118 B2 * | 1/2009 | Ikuta | | H05K 1/0243 |
| | | | | 333/260 |
| 9,338,830 B2 * | 5/2016 | Broughton | | H01R 12/59 |
| 9,648,774 B2 * | 5/2017 | Neumann | | H01R 9/2458 |
| 9,899,715 B2 * | 2/2018 | Yosui | | H01P 3/026 |
| 9,972,880 B2 * | 5/2018 | Lindsey | | B33Y 80/00 |
| 10,051,725 B2 * | 8/2018 | Kawazu | | H05K 1/111 |
| 10,123,434 B2 * | 11/2018 | Yun | | G06F 1/163 |
| 10,194,540 B2 * | 1/2019 | Sun | | H10K 59/87 |
| 10,225,938 B2 * | 3/2019 | Yoo | | G02F 1/1333 |
| 10,522,894 B2 * | 12/2019 | Nishihara | | H01P 3/081 |
| 10,594,014 B2 * | 3/2020 | Wakita | | H01P 5/085 |
| 10,653,018 B2 * | 5/2020 | Eshelman | | H01R 13/08 |
| 10,681,839 B2 * | 6/2020 | Guillot | | H05K 7/20181 |
| 10,804,615 B2 * | 10/2020 | Shiozaki | | H05K 1/0243 |
| 10,827,631 B2 * | 11/2020 | Liu | | G09F 9/301 |
| 10,914,757 B2 * | 2/2021 | Williams | | H05K 1/118 |
| 11,233,355 B2 * | 1/2022 | Sitbon | | H01R 13/6205 |
| 11,251,512 B2 * | 2/2022 | Dogiamis | | H01R 9/00 |
| 11,317,027 B2 * | 4/2022 | Noguchi | | H05K 1/181 |
| 11,476,554 B2 * | 10/2022 | Dogiamis | | H01P 3/16 |
| 11,493,889 B2 * | 11/2022 | Yang | | A61B 5/25 |
| 11,539,151 B2 * | 12/2022 | Arnold | | H01P 5/085 |
| 11,737,224 B2 * | 8/2023 | Suga | | H10K 59/87 |
| | | | | 361/807 |
| 11,785,712 B2 * | 10/2023 | Hanazawa | | H05K 7/1427 |
| | | | | 361/749 |
| 12,022,629 B2 * | 6/2024 | Fan | | A41D 1/005 |
| 2001/0021596 A1 * | 9/2001 | Tamura | | H01R 12/52 |
| | | | | 439/66 |
| 2002/0012218 A1 * | 1/2002 | Li | | H05F 3/02 |
| | | | | 361/753 |
| 2009/0267711 A1 * | 10/2009 | Kawabata | | H01P 1/227 |
| | | | | 333/81 A |
| 2011/0226518 A1 * | 9/2011 | Ohhira | | H01P 3/003 |
| | | | | 29/847 |
| 2023/0320021 A1 * | 10/2023 | Kamgaing | | H01L 23/66 |
| | | | | 361/679.02 |
| 2024/0113409 A1 * | 4/2024 | Spera | | H01P 5/16 |

FOREIGN PATENT DOCUMENTS

| | | | | | | |
|---|---|---|---|---|---|---|
| CN | 107636515 A | * | 1/2018 | | | G02F 1/0102 |
| CN | 108601313 A | * | 9/2018 | | | H05K 7/20509 |
| CN | 112888238 A | * | 6/2021 | | | H05K 7/20336 |
| CN | 117579733 A | * | 2/2024 | | | H05K 7/14 |
| EP | 0358814 A1 | * | 3/1990 | | | H01R 24/42 |
| EP | 0347398 B1 | * | 9/1993 | | | H01P 5/085 |
| EP | 0924809 A2 | * | 6/1999 | | | H01R 24/50 |
| EP | 1006604 A2 | * | 6/2000 | | | H01P 3/06 |
| JP | H081172 | * | 7/1996 | | | |
| KR | 100775410 B1 | | 12/2007 | | | |
| KR | 101171213 B1 | * | 8/2012 | | | H01P 5/12 |
| WO | WO-0046882 A1 | * | 8/2000 | | | H01R 24/50 |

* cited by examiner

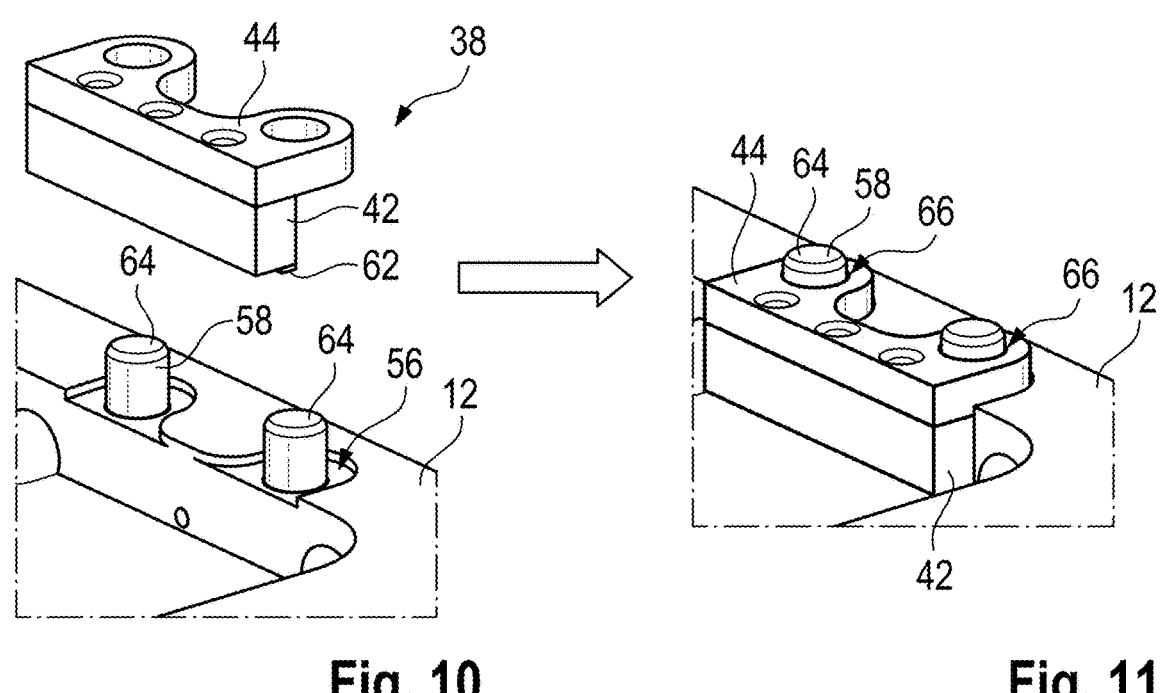
Fig. 10                         Fig. 11
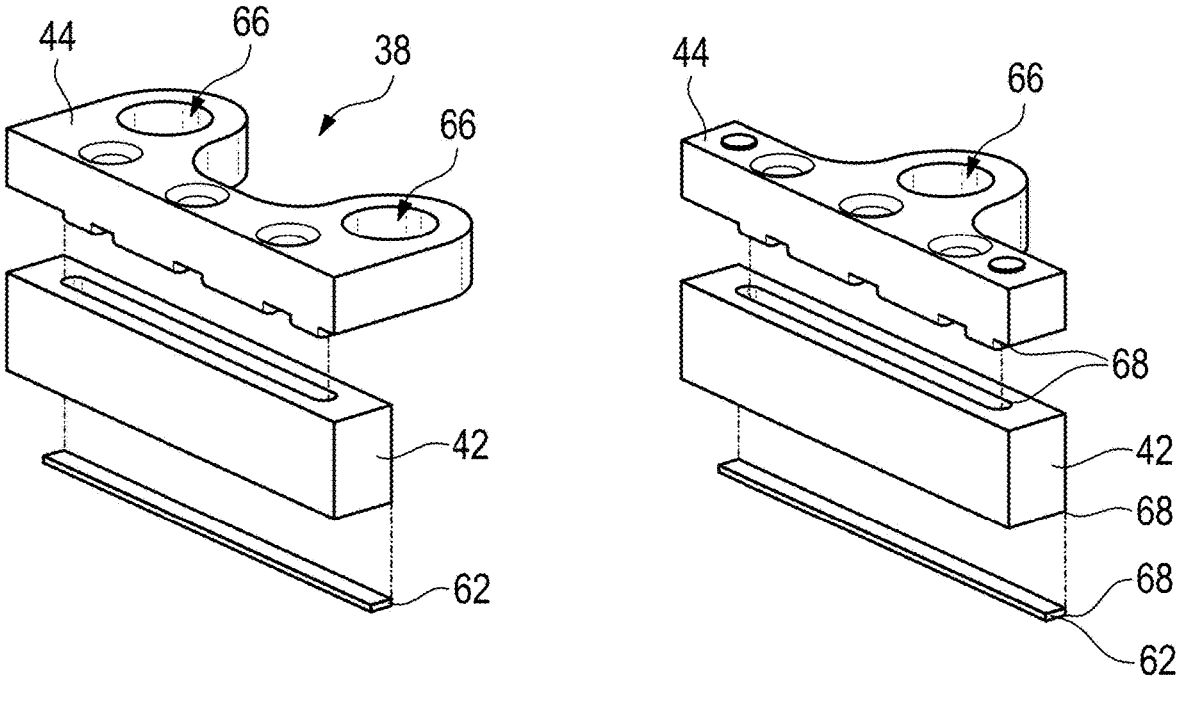
Fig. 12                         Fig. 13

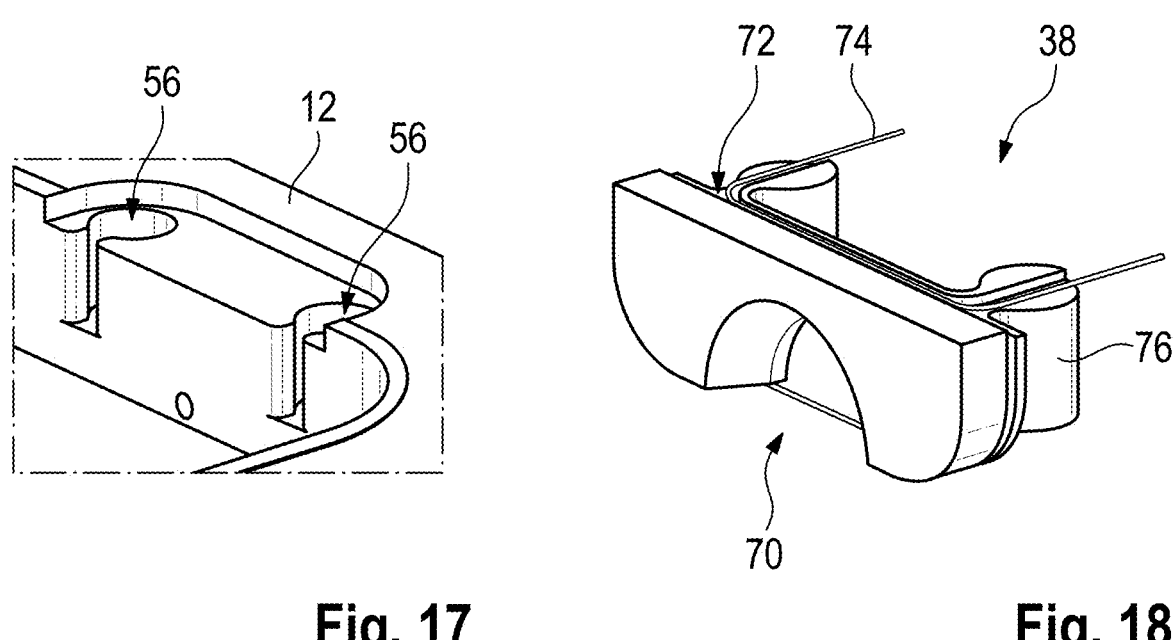
Fig. 17
Fig. 18
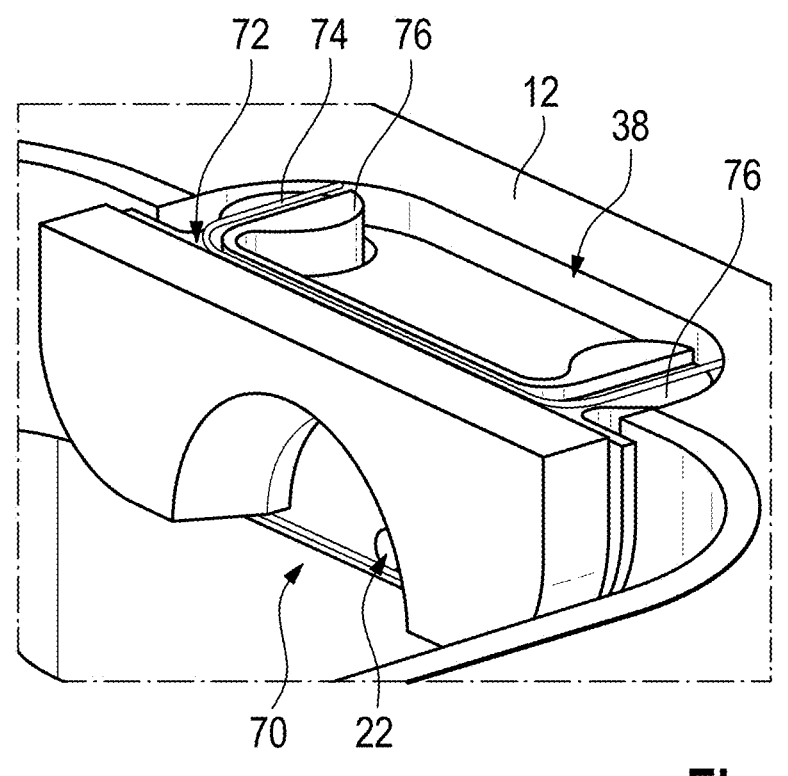
Fig. 19

MICROWAVE DEVICE WITH NON-DESTRUCTIVE DETACHABLE CONNECTION FOR HIGH FREQUENCY APPLICATION

FIELD OF THE DISCLOSURE

Embodiments of the present disclosure relate to a microwave device for high frequency application.

BACKGROUND

In the state of the art, microwave devices for high frequency applications are known which comprise a coaxial connector for connecting a coaxial cable. The coaxial connector comprises at least one inner conductor that is electrically connected with a circuit structure of the microwave device located within a housing of the microwave device. Typically, the connection of the inner conductor with the at least one circuit structure is established by means of a welded joint or a soldered joint. The welded joint or the soldered joint ensures that the microwave device can be used for high frequency applications.

However, replacing the coaxial connector in case of wear or other impairments of the coaxial connector is complicated, as the welded joint or the soldered joint has to be broken in order to be enabled to replace the coaxial connector or a component thereof, e.g. the inner conductor. When breaking the welded joint or the soldered joint, the circuit structure may be damaged, causing further components to be replaced. Consequently, the overall costs are increased.

Other coupling mechanisms are known in the state of the art, which allow replacement of the coaxial connector or a component thereof while reducing the risk of damages for other components. These coupling mechanisms however are not suitable for high frequency applications.

Accordingly, there is a need for a microwave device that ensures easy and cost-efficient replacement of a component of a connector, e.g. an inner conductor, while simultaneously being suitable for high frequency applications.

SUMMARY

Embodiments of the present disclosure provide a microwave device for high frequency application. In an embodiment, the microwave device comprises a housing that encompasses a space, for instance a reception space. At least one circuit structure is accommodated in the housing. The at least one circuit structure comprises a substrate, for instance a ceramic, and at least one integrated circuit (IC) component arranged on the substrate. In addition, an electrically conductive flexible band is provided, for instance established as a foil and/or by a mesh material, which is attached to the substrate. The electrically conductive flexible band is electrically connected to the at least one integrated circuit component.

In an embodiment, the electrical connection between the electrically conductive flexible band and the at least one integrated circuit component may be a direct connection or an indirect connection.

In an embodiment, the housing has an opening through which an inner conductor is fed so as to extend into the space encompassed by the housing, namely the reception space. The inner conductor is electrically connected to the electrically conductive flexible band, for example, in a non-destructive detachable manner.

The main idea is to establish the connection between the inner conductor and the integrated circuit component via the electrically conductive flexible band such that the connection is detachable in a non-destructive manner. In an embodiment, this can be ensured since the inner conductor is electrically connected to the electrically conductive flexible band in the non-destructive detachable manner, thereby providing the mechanism that allows the detaching of the connection in the non-destructive manner. Therefore, the inner conductor can be interchanged easily. In other words, replacement of the inner conductor can be done in a simplified manner, as it is not necessary to break a joint via which the inner conductor is connected to the at least one integrated circuit component, for instance a soldered joint or a welded joint as used in the state of the art. The risk of further damages when interchanging or replacing the inner conductor is reduced significantly.

In embodiments herein, an electrical connection, also called electrical contact, means that a direct electrical connection/contact is provided between the components involved, namely the inner conductor and the electrically conductive flexible band or between the electrical conductive flexible band and the at least one integrated circuit component. Therefore, the electrical connection/contact may also be called galvanic connection/contact. In other words, no optical, capacitive or inductive coupling is provided between the components involved.

The connection that is established in a non-destructive detachable manner means that the connection can be detached without destroying the components connected with each other. For instance, a mechanical connection by a form fit and/or a frictional contact may be provided, which may simultaneously ensure that the electrical connection is established between the components involved. However, no soldered joint, welded joint or laser(-welded) joint is provided since the components connected with each other by such a joint would be destroyed at least partly in case of breaking the respective joint. In other words, a soldered joint, a welded joint or a laser(-welded) joint does not provide a connection in a non-destructive detachable manner. Accordingly, the non-destructive detachable connection between the inner conductor and the electrically conductive flexible band is free of solder and welding material.

In an embodiment, the electrically conductive flexible band is made of a flexible material that is also electrically conductive. Moreover, the material is shaped in a band-like manner, e.g. like a stripe.

Generally, the housing may comprise a bottom side and side walls, for instance four side walls. In case of a rectangular housing, the bottom wall is perpendicular with respect to the respective side walls.

In an embodiment, the substrate of the at least one circuit structure may be located on an inner surface of the bottom side, for instance via spacers or fixing parts which ensure proper spacing.

In an embodiment, the opening via which the inner conductor is fed may be provided in one of the side walls of the housing. Moreover, a sealing may be provided in the opening such that the (reception) space is sealed to the exterior, thereby ensuring that no dirt and/or moisture may enter.

An aspect provides that the electrically conductive flexible band, for example, is at least partially bent around the inner conductor. The at least partial bending of the electrically conductive flexible band ensures a good electrical contact between the electrical conductive flexible band and the inner conductor. For instance, the electrically conductive flexible band is fully bent around the inner conductor such that the entire outer surface of the inner conductor is contacted by the electrically conductive flexible band, namely along the circumference of the inner conductor.

Another aspect provides that the microwave device comprises, for example, a clamping component that presses on the electrically conductive flexible band. The clamping component presses on the electrically conductive flexible band, thereby applying a defined pressure on the inner conductor around which the electrically conductive flexible band is provided at least partially. Hence, a good connection between the electrically conductive flexible band and the inner conductor is ensured such that the electrical properties/characteristics of the connection established are defined due to the clamping/press contact. The clamping component ensures that no soldered joint or welded joint is necessary for electrically connecting the inner conductor and the electrically conductive flexible band, as the electrically conductive flexible band is pressed on the inner conductor by the clamping component.

For instance, the clamping component has an indentation for the inner conductor. The indentation provides space for the inner conductor. Moreover, the indentation may be shaped such that the electrically conductive flexible band at least partially bends around the inner conductor due to the shape of the indentation. In other words, the circumference of the inner conductor is accommodated by the indentation of the clamping component at least partly. The interacting surface between the inner conductor and the clamping component can be increased due to the indentation. For instance, a curved surface is provided at the indentation, which presses the electrically conductive flexible band onto the inner conductor in case of establishing the respective connection between the electrically conductive flexible band and the inner conductor by the clamping component. Then, the electrically conductive flexible band bends around the inner conductor at least partly due to the shape of the curved surface.

In an embodiment, the indentation may extend along an axial direction of the clamping component, which coincides with the axial length of the inner conductor.

In an embodiment, the clamping component may be connected to the housing by a screwing connection or a snap-in connection. The screwing connection or the snap-in connection ensures that a defined clamping force can be applied by fastening the screws accordingly. The snap-fit connection may also ensure a defined pressure applied onto the inner conductor. Generally, a defined and replicable clamping is ensured, for example when interchanging or replacing the inner conductor.

In an embodiment, the clamping component may be made of a dielectric material at least partly. For instance, the entire clamping component is made of a dielectric material. The dielectric material may be a plastic material, for example a PEEK (polyether ether ketone) material. This ensures that no electrically conductive connection is established via the clamping component.

In an embodiment, the clamping component may comprise a main portion and a holding portion that presses on the electrically conductive flexible band. Either a resilient material is arranged between the main portion and the holding portion or the holding portion is a resilient element. Therefore, a defined clamping force can be established, as the clamping component is connected to the housing via the main portion so as to provide a fixed mechanical connection, whereas the holding portion interacts with the electrically conductive flexible band that is pressed onto the inner conductor.

For instance, the resilient element is configured such that a defined clamping force is applied on the electrically conductive flexible band. The resilient element ensures that a defined pressure on the electrically conductive flexible band such that the electrically conductive flexible band is pressed onto the inner conductor with a defined force. In an embodiment, the resilient element may compensate any temperature fluctuations appropriately, which might cause a different pressure/force onto the electrically conductive flexible band. In an embodiment, the resilient element may expand or shrink due to changing temperatures, thereby compensating the temperature fluctuations, for example the ones occurring during operation of the microwave device.

Another aspect provides that the clamping component comprises, for example, a main portion and a holding portion that is movable with respect to the main portion. Thus, the clamping force can be applied via the holding portion, as the holding portion is moved with respect to the main portion. The electrically conductive flexible band may be connected to the clamping component, for example to both the main portion and the holding portion.

For establishing the respective connection of the electrically conductive flexible band with the clamping component, the electrically conductive flexible band may be initially connected to the holding portion, for example adhered. Afterwards, the electrically conductive flexible band may also be connected to the main portion, for example adhered. In an embodiment, the holding portion may be moved from a first position to a second position in order to allow the connection, e.g. adhesion, to the main portion, as the holding portion is moved into the second position in which it is retracted with respect to the main portion.

In an embodiment, the clamping component may comprise a resilient element at its surface facing towards the electrically conductive flexible band. The resilient element may be provided by a part separately formed with respect to the holding portion. However, the resilient element may also establish the holding portion.

For instance, the resilient element is established by a foam material, a liquid crystal polymer (LCP) stripe, a string, a band or a D-shaped part. In any case, the resilient element ensures that a defined clamping force is applied on the electrically conductive flexible band that electrically contacts the inner connector. In other words, the resilient element presses onto the electrically conductive flexible band that contacts the inner conductor. Due to the flexibility of the resilient element, the force/pressures applied onto the inner conductor by the electrically conductive flexible band is defined, e.g. by the characteristics of the resilient element that contacts the electrically conductive flexible band. In an embodiment, the resilient element adapts its shape when contacting the electrically conductive flexible band such that the pressure/force applied onto the inner conductor is (substantially) constant, as any excess pressure/force is compensated by the resilient element.

In an embodiment, the clamping component may comprise a groove into which the resilient element is inserted. The resilient element may be restrained in the groove, thereby defining a pressure/force to be applied by the clamping component via the resilient element that interacts with the electrically conductive flexible band.

In an embodiment, the clamping component has at least one opening into which a corresponding protrusion is inserted when connecting the clamping component with the housing. The corresponding protrusion may be established by the housing or separately formed while being inserted into an opening of the housing as well.

Alternatively or additionally, the housing has at least one opening into which a corresponding protrusion is inserted when connecting the clamping component with the housing. The corresponding protrusion may be established by the clamping component or separately formed while being inserted into an opening of the clamping component as well.

For instance, the clamping component has one protrusion and one opening, wherein the housing has one opening and one protrusion, and wherein the protrusion of the clamping component corresponds to the opening of the housing and the protrusion of the housing corresponds to the opening of the clamping component.

Generally, the respective protrusion may have a circular cross-section or a certain shape, wherein the corresponding opening has a shape that mates the shape of the protrusion. Accordingly, a matching connection is established.

In an embodiment, the clamping component may have two openings into which corresponding protrusions, for instance protrusions of the housing, are inserted when connecting the clamping component with the housing. Alternatively, the clamping component has two protrusions that are inserted into corresponding openings in the housing when connecting the clamping component with the housing. Therefore, a snap-fit connection can be established, as two openings and corresponding protrusions interact with each other in order to provide a defined positioning for the clamping component with respect to the housing.

In an embodiment, the protrusions may be obtained by cutting the housing or the clamping component accordingly, for instance by a milling process.

Alternatively, the protrusions may be established by separately formed parts that are inserted into corresponding holes in the housing or the clamping component. The separately formed protrusions may be pressed/inserted into the respective holes in order to ensure a proper connection.

In an embodiment, the clamping component may be made of several separately formed parts that are connected with each other for forming the clamping component, for instance adhered with each other. The several separately formed parts may comprise the main portion and the holding portion. For instance, the main portion is made of multiple separately formed parts. The respective connections of the several separately formed parts may be established by a glue or an adhesive. The adhesive or glue may provide the resilient element simultaneously, for example the resilient element that is arranged between the components.

In an embodiment, the microwave device may comprise a lid for closing the space encompassed by the housing, namely the reception space. The lid may be placed on the housing, for example the side walls, in order to close the space that accommodates the at least one circuit structure. For instance, the lid may be pressed into the housing, thereby sealing the housing simultaneously.

In an embodiment, the electrically conductive flexible band may be attached to the at least one circuit structure, for example the substrate, by a soldered joint, a welded joint, a laser(-weld) joint, an adhesive joint, a bonded joint or a clamped joint. Therefore, the connection between the electrically conductive flexible band and the at least one circuit structure may be provided by a non-detachable connection or a connection detachable solely in a destructive manner. Consequently, the connection between the substrate and the electrically conductive flexible band is different to the connection established between the electrically conductive flexible band and the inner conductor.

In an embodiment, the inner conductor may be part of a coaxial connector or a connector arrangement. The respective coaxial connector or the connector arrangement may be part of a port of the microwave device. A (coaxial) cable may be connected with the microwave device via the port.

For instance, the coaxial connector or the connector arrangement is mechanically connected at an outer surface of the housing of the microwave device. In other words, the port is provided at the outer surface of the housing. The mechanical connection of the coaxial connector or the connector arrangement may be detachable such that the coaxial connector or the connector arrangement can be replaced if necessary, for instance due to wear of the coaxial connector or the connector arrangement.

Generally, the coaxial connector or the connector arrangement may be configured to receive a signal with a frequency larger than 50 GHz. Therefore, the microwave device is generally enabled to process signals for high frequency applications.

In an embodiment, the at least one integrated circuit component may comprise a conductor, a capacitor, a coil, a resistor, etc. Several integrated circuit components may be arranged on the substrate which together form an integrated circuit on the substrate. For instance, a monolithic microwave integrated circuit (MMIC) is arranged on the substrate, which comprises the at least one integrated circuit component.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 10 schematically shows a snap-in connection of the clamping component and the housing according to an embodiment in an unassembled state;

FIG. 11 schematically shows the snap-in connection of the clamping component and the housing according to FIG. 10 in an assembled state;

FIG. 12 schematically shows an exploded view of the clamping component;

FIG. 13 schematically shows the clamping component according to another embodiment in an explosion view;

FIG. 17 schematically shows the snap-in connection portion at the housing according to a further embodiment;

FIG. 18 schematically shows the snap-in connection portion at the clamping component according to a further embodiment;

FIG. 19 schematically shows the snap-in connection established by the snap-in connection portion at the housing according to FIG. 17 and the snap-in connection portion at the clamping component according to FIG. 18;

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
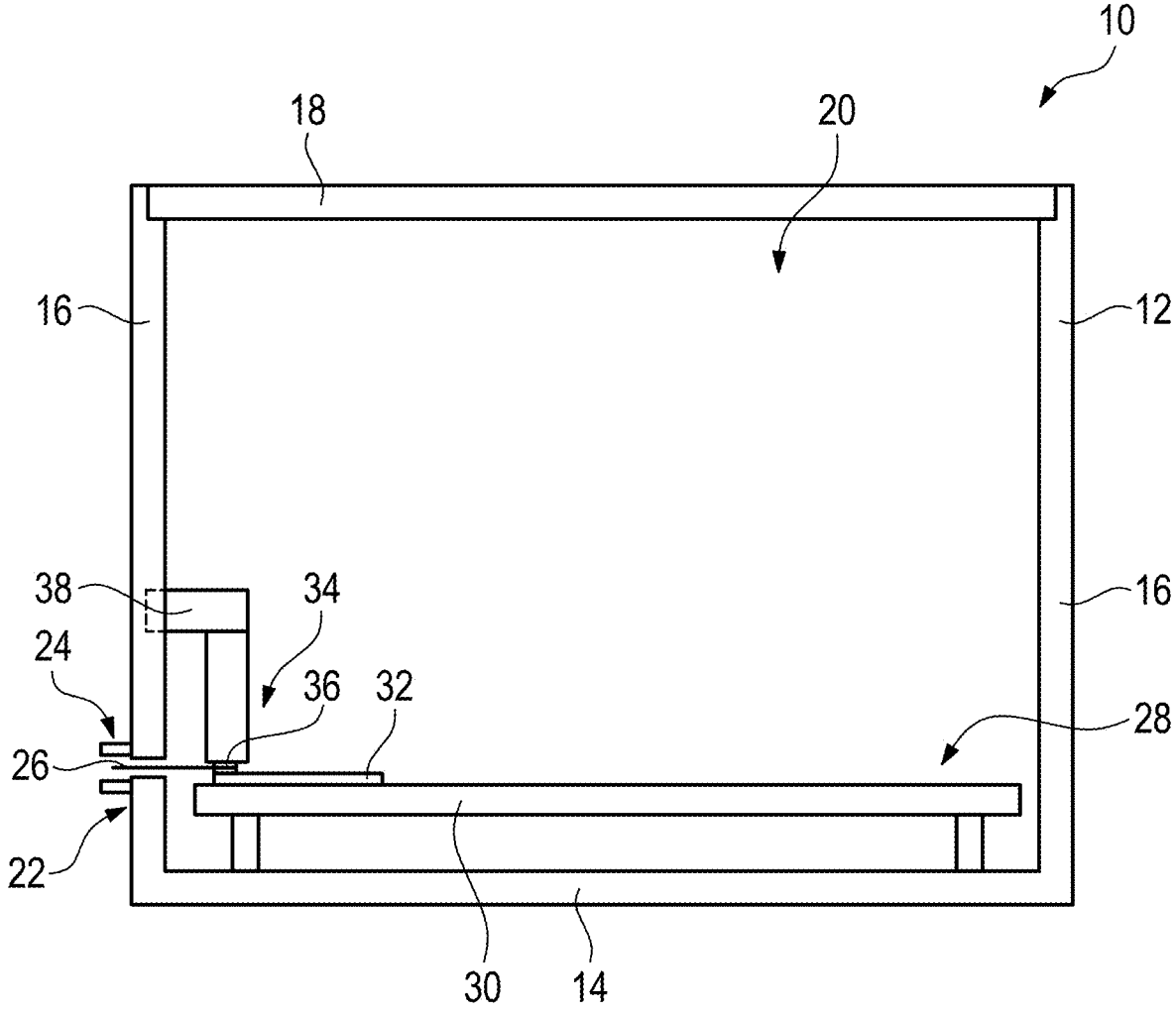
FIG. 1 schematically shows a microwave device according to an embodiment according to the present disclosure.

FIG. 1 shows a microwave device 10 that comprises a housing 12 with a bottom wall 14 and side walls 16 as well as a separately formed lid 18 that can be placed on the housing 12 in order to close and, optionally, seal a space 20 that is encompassed by the housing 12. In the embodiment shown, the housing 12 comprises at least one opening 22 to which a coaxial connector 24 is associated. Accordingly, an inner conductor 26 of the coaxial connector 24 is fed through the opening 22 so as to extend into the space 20 that is encompassed by the housing 12.

At least one circuit structure 28 is located in the space 20. The circuit structure 28 comprises a substrate 30 and at least one integrated circuit component 32 that is arranged on the substrate 30. Hence, the at least one circuit structure 28 is accommodated in the housing 12.

Generally, the at least one integrated circuit component 32 may comprise, for example, a conductor, a capacitor, a coil or a resistor. Several integrated circuit components 32 may be arranged on the substrate 30 which together form an integrated circuit on the substrate 30. According to an example, a monolithic microwave integrated circuit (MMIC) is arranged on the substrate 30, which comprises the at least one integrated circuit component 32.

The microwave device 10 may further comprise a non-destructive detachable connection 34 between the inner conductor 26 and the at least one integrated circuit component 32. In an embodiment, the non-destructive detachable connection 34 is provided by an electrically conductive flexible band 36 that is electrically connected to the at least one circuit structure 28, for example the substrate 30. The electrical connection between the electrically conductive flexible band 36 and the at least one circuit structure 28, for example the substrate 30, may be established by a soldered joint, a welded joint, a laser joint, an adhesive joint, a bonded joint, a clamped joint, etc.

Additionally, the electrically conductive flexible band 36 is electrically connected to the inner conductor 26 in a non-destructive detachable manner, thereby establishing the detachable connection 34 between the inner conductor 26 and the at least one circuit structure 28, for example the substrate 30, in a non-destructive manner.

As already illustrated in FIG. 1 in a schematic manner, the electrically conductive flexible band 36 is at least partially bent around the inner conductor 26 such that a large contacting surface between both components is obtained, namely between the electrically conductive flexible band and the inner conductor 26. In other words, the electrical connection/contact corresponds to a direct electrical connection/contact between the inner conductor 26 and the electrically conductive flexible band 36, which is also called galvanic connection/contact.

To ensure a defined electrical connection/contact between the inner conductor 26 and the electrically conductive flexible band 36 bent or wrapped around the inner conductor 26, a clamping component 38 is provided that presses on the electrically conductive flexible band 36 so as to ensure proper contact of the electrical conductive flexible band 36 with the inner conductor 26.

Figure 2:
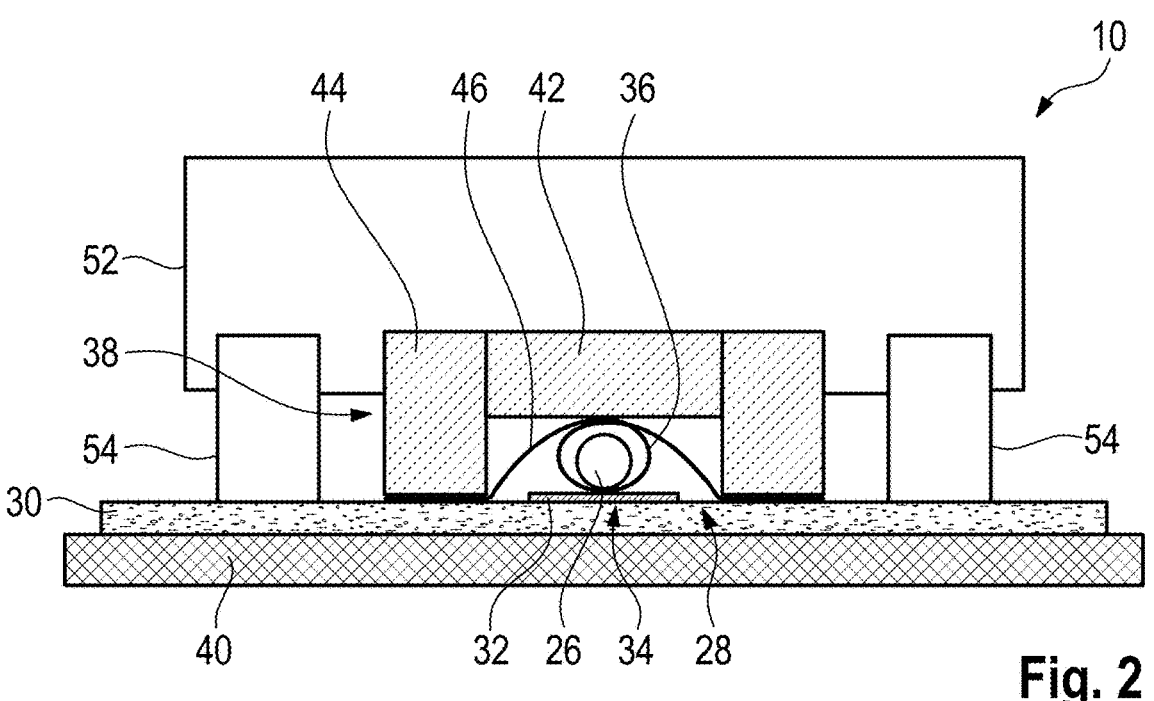
FIG. 2 schematically shows a front view on the microwave device according to an embodiment according to the present disclosure.

In FIG. 2, the clamping component 38 is shown in more detail. FIG. 2 is a front view which also illustrates a cross-sectional view of the microwave device 10.

As shown in the embodiment of FIG. 2, the at least one integrated circuit component 32 is arranged on the substrate 30, thereby forming the circuit structure 28. The substrate 30 is located on a carrier 40, for instance a carrier 40 established by an interconnect device. The inner conductor 26 is connected with the at least one integrated circuit component 32, for instance a conductor. In addition, the electrically conductive flexible band 36 is bent around the inner conductor 26 so as to establish the non-destructive detachable connection 34.

In the shown embodiment, a clamping component 38 comprises a holding portion 42 as well as a main portion 44, wherein the holding portion 42 is movable with respect to the main portion 44. The main portion 44 and the holding portion 42 may be made of, for example, a dielectric material, for instance a plastic material, for instance PEEK. In an embodiment, the entire clamping component 38 is made of the dielectric material.

For providing the electrical contact with defined electrical properties/characteristics, the holding portion 42 can be moved relatively to the main portion 44 such that the electrically conductive flexible band 36 bent at least partially around the inner conductor 26 is pressed onto the inner conductor 26 in a defined manner.

In the embodiment shown in FIG. 2, a further electrically conductive flexible band 46 is provided that is connected to the main portion 44 and the holding portion 42, for instance by an adhesion. The further electrically conductive flexible band 46 may also be a mesh material. Hence, the further electrically conductive flexible band 46 can be a foil or a stripe, which is connected to the clamping component 38.

Figure 25:
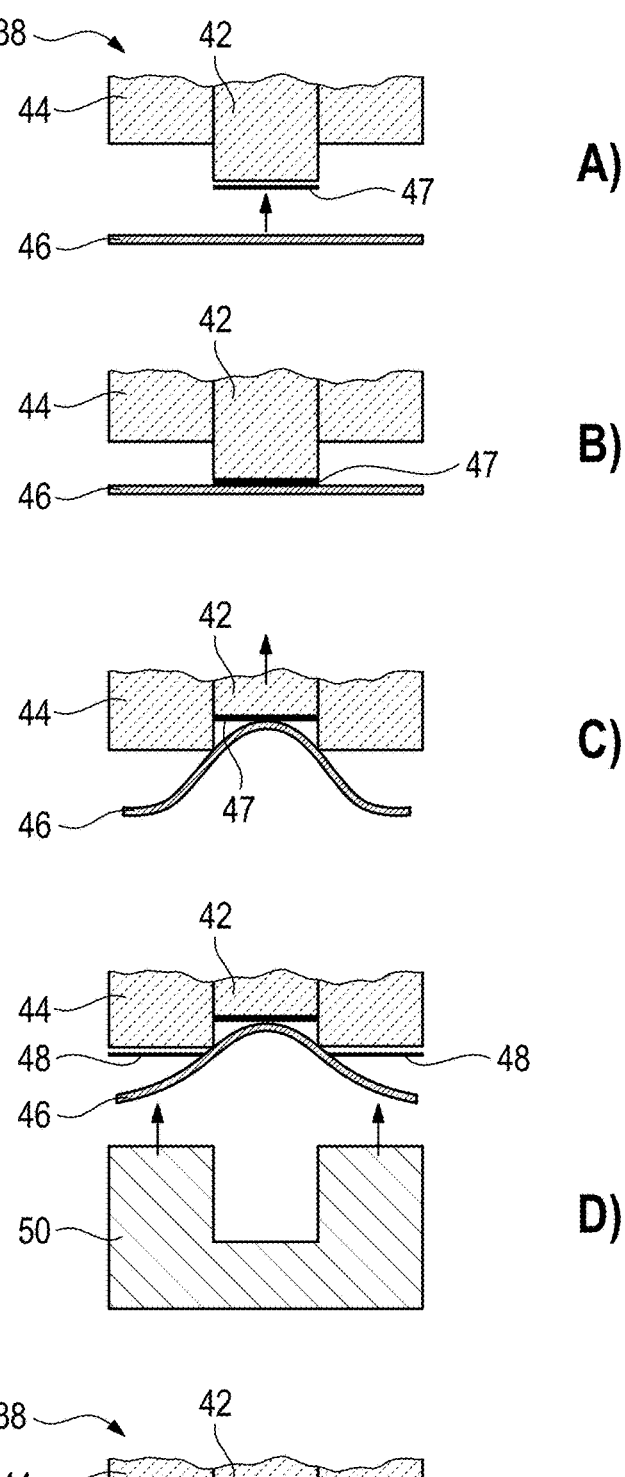
FIGS. 25A-25E schematically show an overview that illustrates the connection of an electrically conductive flexible band at the clamping component.

In FIGS. 25A-25E, it is shown how the further electrically conductive flexible band 46 is connected to the clamping component 38, for example the main portion 44 as well as the holding portion 42. In FIG. 25A, an adhesive 47 is provided on a surface of the holding portion 42 facing the further electrically conductive flexible band 46. In FIG. 25B, the further electrically conductive flexible band 46 is contacted by the holding portion 42 such that the further electrically conductive flexible band 46 is adhered to the holding portion 42. In FIG. 25C, the holding portion 42 is moved relatively to the main portion 42 along the arrow shown, e.g. retracted, such that the further electrically conductive flexible band 46 is bent partly. In FIG. 25D, another adhesive 48 or the same adhesive is provided on a surface of the main portion 44, which faces the further electrically conducive flexible band 46. Then, a tool 50 is used to press the free ends of the further electrically conductive flexible band 46 on the adhesive 48 provided on the main portion 44 so as to also connect the further electrically conductive flexible band 46 with the main portion 44.

Thus, an adhesive connection is obtained between the further electrically conductive flexible band 46 and the clamping component 38 as shown in FIG. 25E. The arrangement obtained via the process described with reference to FIGS. 25A-25E is shown in FIG. 2.

In an embodiment, the clamping component 38 obtained has the further electrically conductive flexible band 46 that may simultaneously act as a resilient element. In an embodiment, the electrically conductive flexible band 36 bent around the inner conductor 26 is contacted by the further electrically conductive flexible band 46 when the clamping component 38 applies the clamping force.

In an embodiment, the clamping may be provided by putting the lid 18 onto the housing 12 such that a force is applied on the clamping component 38, for example via a main body 52 of the clamping component 38. The main body 52 and the main portion 44 may be established in an integral manner such that the main body 52 and the main portion 44 together form one piece. The holding portion 42 however may be movable with respect thereto.

In an embodiment, the microwave device 10 may comprise spacers 54 that may be established as thrust members in order to ensure proper relative movement of the clamping component 38 with respect to the circuit structure 28. In an embodiment, the relative movement of the clamping component 38, for example the main body 52 of the clamping component 38 interacting with the lid 18, is limited by the spacers 54, which are also located on the substrate 30. In an embodiment, the spacers 54 have a height that is adapted to the height of the main portion 44 of the clamping component 38, as illustrated in FIG. 2. Hence, the relative movement is limited accordingly.

Figure 3:
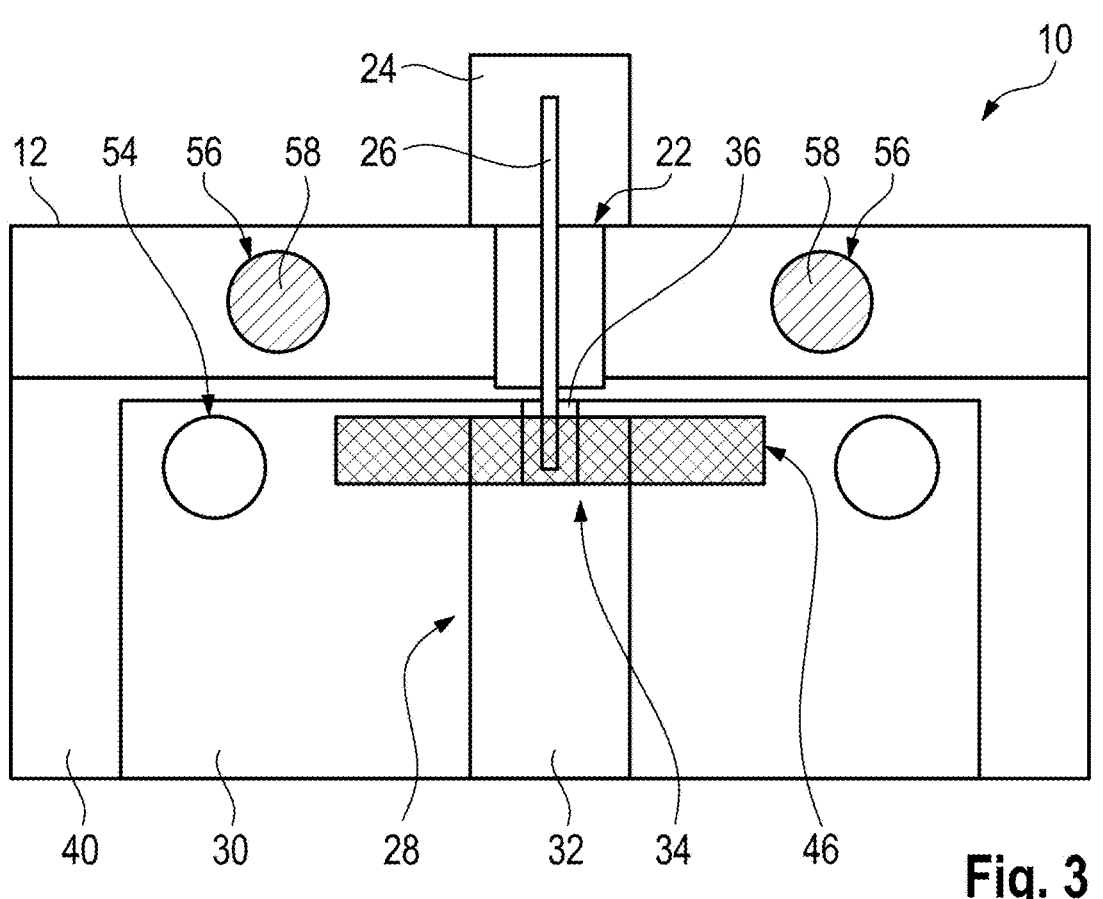
FIG. 3 schematically shows a top view on the microwave device according to FIG. 2.

In FIG. 3, a top view on the illustration of FIG. 2 is shown in order to further illustrate the concept of clamping the inner conductor 26 of the coaxial connector 24 by the non-destructive detachable connection 34, for example the electrically conductive flexible band 36 bent around the inner conductor 26 at least partly. FIG. 3 further shows that openings 56 in the housing 12, for example in the side wall 16 or in the bottom wall 14 of the housing 12.

As shown in the embodiment of FIG. 3, the openings 56 interact with protrusions 58 associated with the clamping component 38. For instance, the protrusions 58 are integrally formed with the clamping component 38, for example the main body 52. Alternatively, the protrusions 58 are separately formed bars that are inserted into the openings 56 of the housing 12 while simultaneously being inserted into corresponding holes in the clamping component 28. Irrespective of the specific arrangement, the protrusions 58 are inserted in the openings in order to mechanically connect the clamping component 38 with the housing 12.

Figure 4:
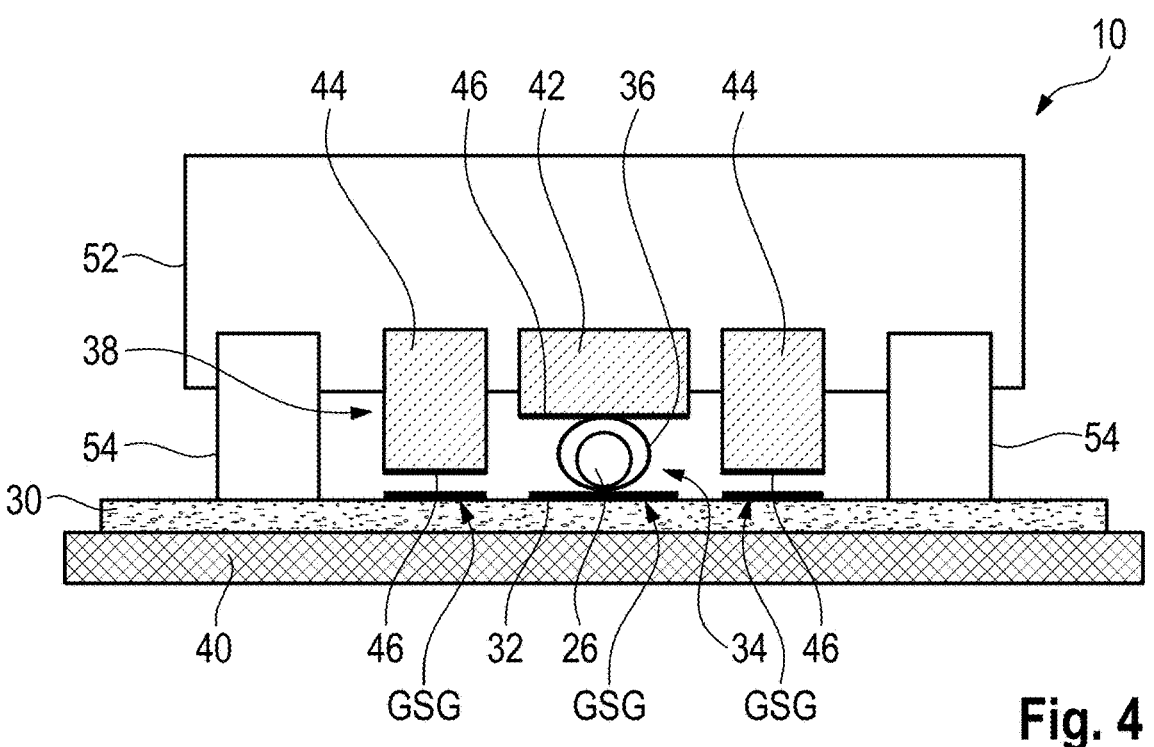
FIG. 4 schematically shows a front view on the microwave device according to another embodiment according to the present disclosure.
Figure 5:
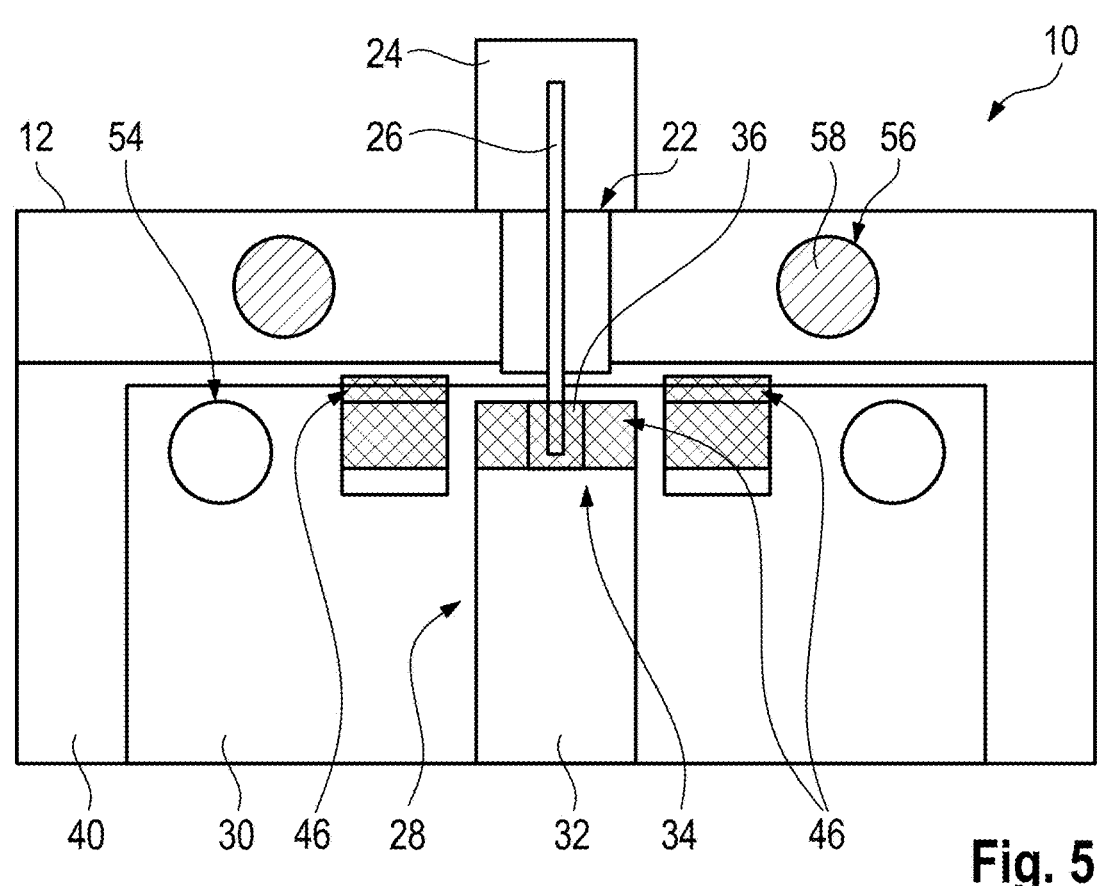
FIG. 5 schematically shows a top view on the microwave device according to FIG. 4.

As discussed above, FIGS. 2 and 3 show that the further electrically conductive flexible band 46 is connected to the holding portion 42 and the main portion 44. Alternatively, the further electrically conductive flexible band 46 is split into separate parts as shown in FIGS. 4 and 5. Consequently, the main portion 44 may also be established by two separate parts such that the main portion 44 together with the holding portion 42 are established by three separate parts.

In an embodiment, a ground connection may be provided, e.g. for an outer conductor of the coaxial connector 24. This is shown in FIG. 5, as the two outer parts of the further electrically conductive flexible band 46 are connected to the substrate 30. The electrically conductive flexible band 36 is pressed onto the inner conductor 26 by the holding portion 42. Thus, a G-S-G (Ground-Signal-Ground) connection is established.

Figure 6:
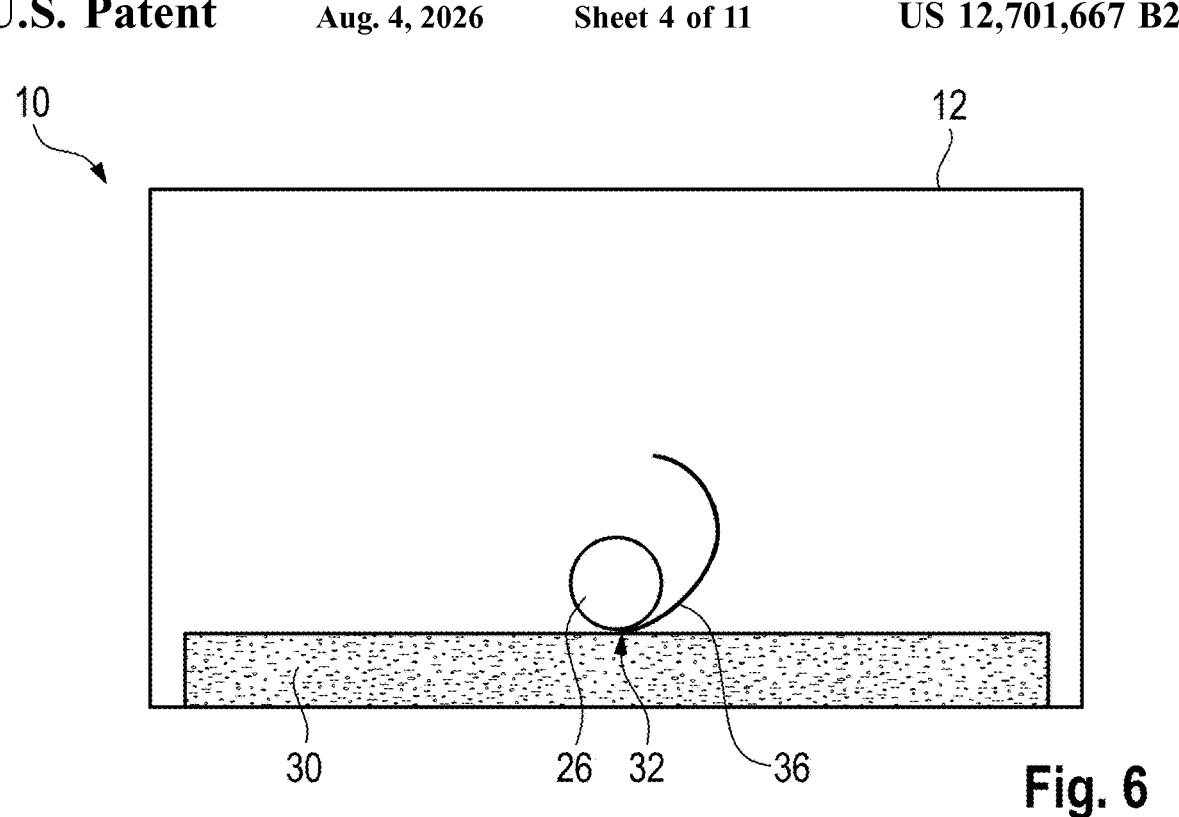
FIG. 6 schematically shows how the electrically conductive flexible band is connected with the circuit structure.
Figure 7:
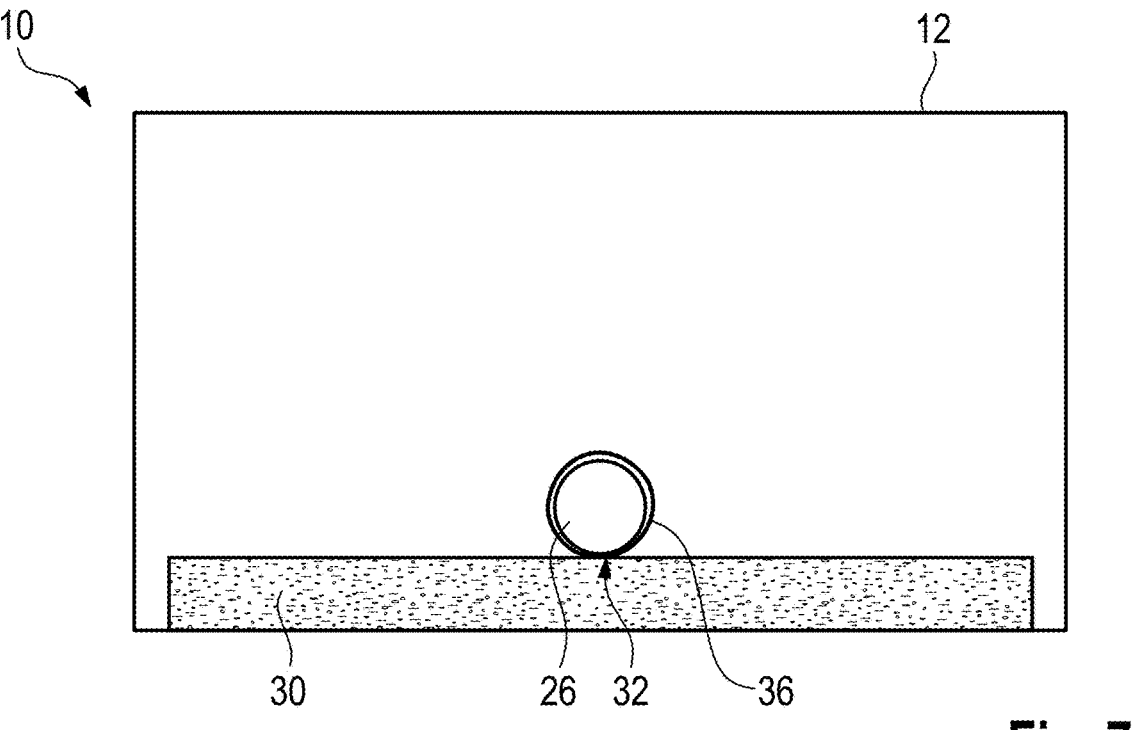
FIG. 7 schematically shows how the electrically conductive flexible band is bent around the inner conductor.
Figures 8, 9:
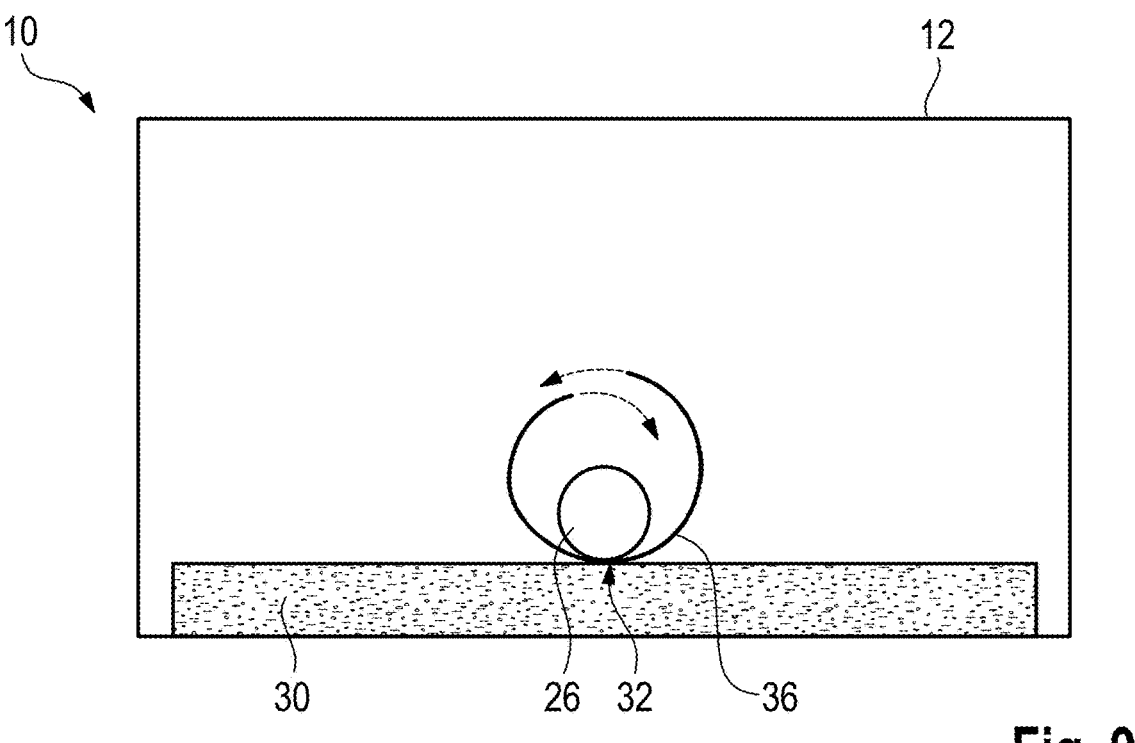
FIG. 8 schematically shows how the electrically conductive flexible band is pressed onto the inner conductor.
FIG. 9 schematically shows another possibility how the electrically conductive flexible band is connected with the circuit structure.

In FIGS. 6-8, it is schematically shown how the electrically conductive flexible band 36 is bent around the inner conductor 26. At the beginning shown in FIG. 6, the electrically conductive flexible band 36 is connected with the at least one integrated circuit component 32 via a first free end. This respective connection may be established by a soldered joint, a welded joint, a laser joint, an adhesive joint, a bonded joint or a clamped joint. Then, the electrically conductive flexible band 36 is bent around the inner conductor 26 such that the other free end of the electrically conductive flexible band 36 gets into contact with the at least one integrated circuit component 32, as shown in FIG. 7.

Afterwards, the clamping component 38, which is shown in another embodiment in FIG. 8, presses onto the electrically conductive flexible band 36 for providing a defined clamping force on the electrically conductive flexible band 36. This results in a defined connection/contact of the inner conductor 26. As discussed above, the clamping component 38 has the main portion 44 as well as the holding portion 42 that is relatively movable with respective to the main portion 44.

In the shown embodiment, a resilient element 60 is arranged between the main portion 44 and the holding portion 42 in order to ensure proper and defined clamping forces to be applied on the electrically conductive flexible band 36. The resilient element 60 also compensates any temperature fluctuations, for example temperature changes occurring during operation of the microwave device 10. Therefore, a defined clamping force/pressure is ensured, FIG. 9 shows an alternative embodiment, as the electrically conductive flexible band 36 is connected with the at least one integrated circuit component 32 via a middle section such that both free ends of the electrically conductive flexible band 36 have to be bent around the inner conductor 26 as illustrated by the dashed arrow in FIG. 9.

This also provides the non-destructive detachable connection 34 between the inner conductor 26 and the electrically conductive flexible band 36.

In FIGS. 10-12, an alternative embodiment of the clamping component 38 is shown in more detail, for example its connection to the housing 12. In the shown embodiment, the clamping component 38 comprises three different parts, as shown in the exploded view according to FIG. 12, namely the main portion 44 to which the holding portion 42 is connected, for instance glued. In addition, a flexible part 62 is connected to a surface of the holding portion 42 facing away from the main portion 44. Accordingly, the electrically conductive flexible band 36 is pressed onto the inner conductor 26 by the holding portion 42, for example the flexible part 62 connected thereto. The flexible part 62 may be a foam material or a liquid crystal polymer (LCP) stripe.

In an embodiment, the clamping component 38 is mechanically connected to the housing 12 by openings 56 of the housing 12, into which protrusions 58 are pressed. In the shown embodiment, the protrusions 58 are established by separately formed bars 64 that are also pressed into openings 66 of the clamping component 38, for example the main portion 44. This is shown in FIG. 11.

In the embodiments shown in FIGS. 10-12, the main portion 44 of the clamping component 38 comprises two openings 66 that interact with the protrusions 58, e.g. the separately formed bars 64. Alternatively, as shown in FIG. 13, only one opening 66 is provided for interacting with a single protrusion 58, e.g. a single separately formed bar 64.

Generally, the respective separately formed parts of the clamping component 38, namely the holding portion 42, the main portion 44 as well as the flexible part 62 can be connected to each other by an adhesive layer 68, as illustrated, for example in FIG. 13.

Figure 14:
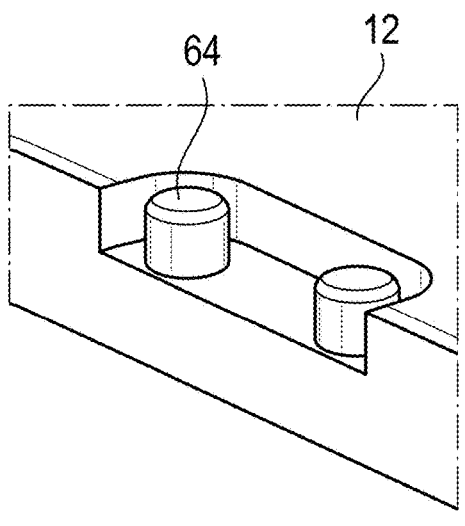
FIG. 14 schematically shows the snap-in connection portion at the housing according to another embodiment.
Figure 15:
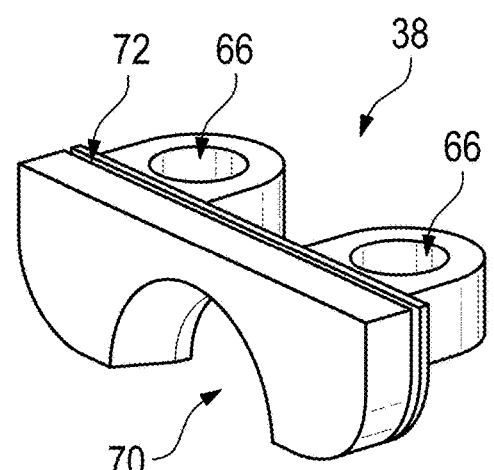
FIG. 15 schematically shows the snap-in connection portion at the clamping component according to another embodiment.
Figure 16:
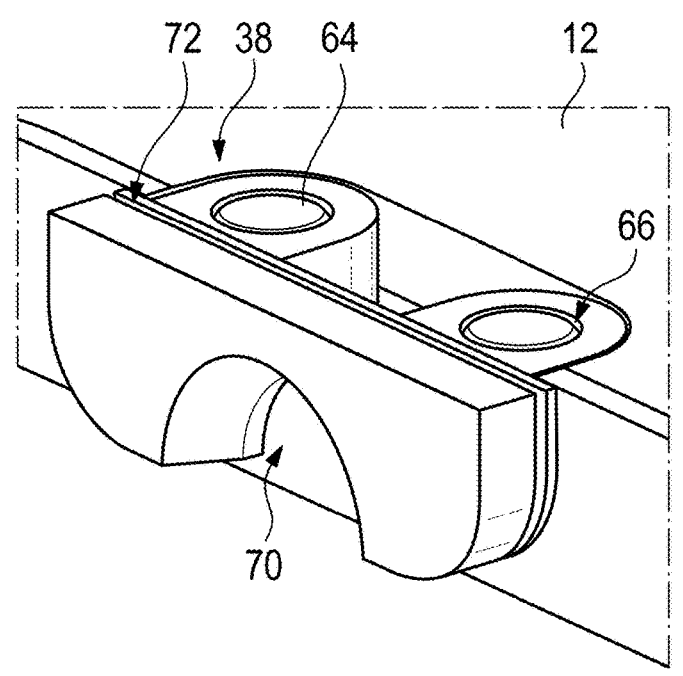
FIG. 16 schematically shows the snap-in connection established by the snap-in connection portion at the housing according to FIG. 14 and the snap-in connection portion at the clamping component according to FIG. 15.

In FIGS. 14-16, a one-piece clamping component 38 is shown, which has an indentation 70 for the inner conductor 26. The indentation 70 has a curved surface facing towards the inner conductor 26 such that the inner conductor 26 is centered and the contact surface is increased appropriately.

In an embodiment, the clamping component 38 has two openings 66 via which the clamping component 38 can be mechanically connected to the housing 12, for example the protrusions 58. In the shown embodiment, the protrusions 58 are made integrally within the housing 12, e.g. by a milling process. Of course, the protrusions 58 may also be established by separately formed bars 64 that are inserted into openings 56 in the housing 12, as discussed with respect to FIGS. 10-12. In a similar manner, the protrusions 58 shown in the embodiment according to FIGS. 10-12 may also be milled into the housing 12.

In an embodiment, the clamping component may also comprise a groove 72 into which a resilient element 74 like a band or string can be placed which simultaneously establishes the flexible part for contacting the electrically conductive flexible band 36. For example, such a band/string is shown in FIGS. 18-19.

In the embodiment shown in FIGS. 17-19, openings 56 are provided in the housing 12, for instance by a milling process. The clamping component 38 comprises protrusions 76 to be inserted or pressed into the openings 56 milled into the housing 12 for mechanically connecting the clamping component 38 with the housing 12. As shown in FIGS. 18-19, the protrusions 76 extend laterally. Moreover, the protrusions 76 also partly comprise the groove 72 along which the resilient element 74 is arranged. In FIG. 19, the opening 22 in the housing 12 is also shown through which the inner conductor 26 is fed.

Figure 20:
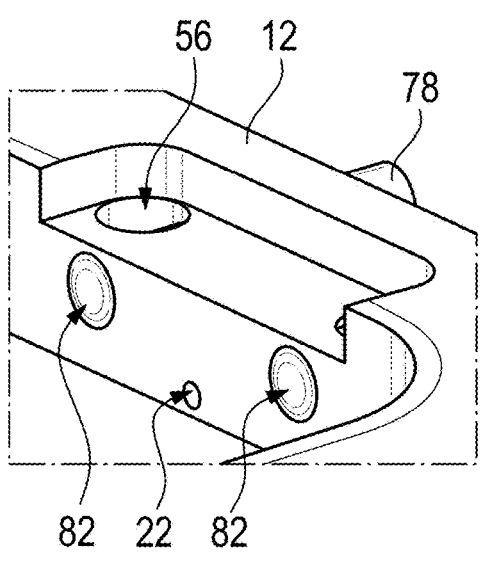
FIG. 20 schematically shows the snap-in connection portion at the housing according to a certain embodiment.
Figure 21:
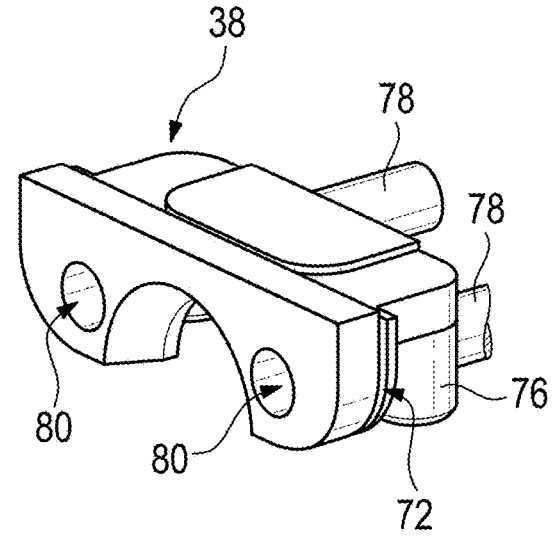
FIG. 21 schematically shows the snap-in connection portion at the clamping component according to a certain embodiment.
Figure 22:
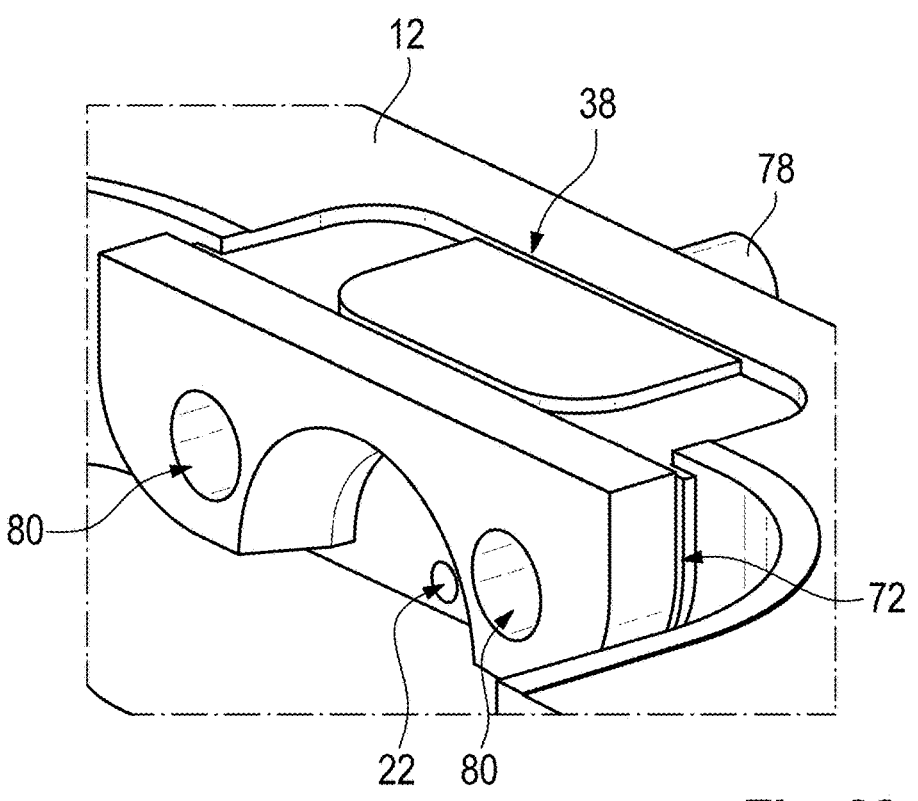
FIG. 22 schematically shows the snap-in connection established by the snap-in connection portion at the housing according to FIG. 19 and the snap-in connection portion at the clamping component according to FIG. 20.

In the embodiment shown in FIGS. 20-22, additional securing bars 78 are shown that are used for securing the clamping component 38 to the housing 12 once the clamping component 38 has been mechanically connected with the housing 12, for instance by the snap-in connection. As shown, the clamping component 38 comprises the protrusions 76 that are inserted into the openings 56 of the housing 12 for mechanically connecting the clamping component 38 with the housing 12.

Afterwards, the securing bars 78 are inserted into holes 80 in the clamping component 38 and holes 82 the housing 12, wherein the respective holes are aligned with each other such that the securing bars 78 can be pushed though the holes of both the clamping component 38 and the housing 12, respectively.

Figure 23:
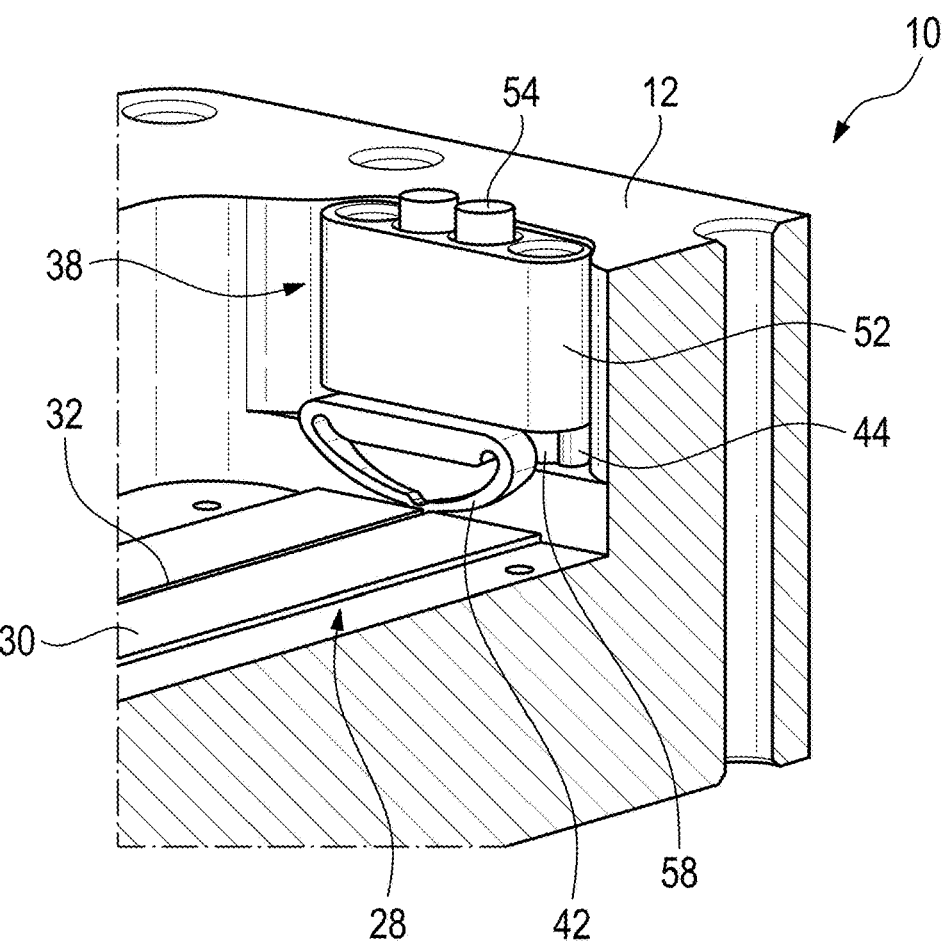
FIG. 23 schematically shows the non-destructive detachable connection according to an embodiment.
Figure 24:
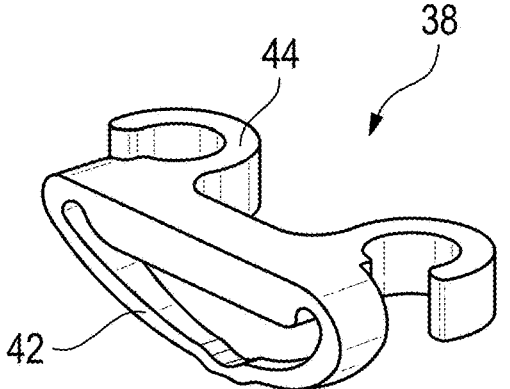
FIG. 24 schematically shows the clamping component used by the non-destructive detachable connection shown in FIG. 23.

In FIGS. 23-24, another embodiment is shown, wherein the clamping component 38 has a D-shaped holding portion 42 that is integrally formed with a main portion 44. The main portion 44 comprises two C-shaped clamps for mechanically connecting the clamping component 38 with the housing 12, for example protrusions 58 that are clamped. Hence, a snap-in connection can be established accordingly.

In an embodiment, the clamping component 38 may additionally comprise the main body 52 at which the spacers 54 are provided which interact with the lid 18 of the microwave device 10. In an embodiment, the lid 18 presses onto the spacers 54 when the lid 18 is placed on the housing 12. The spaces 54 are compressed, wherein a clamping force is forwarded to the D-shaped holding portion 42 that interacts with the inner conductor 26 around which the electrically conductive flexible band 36 is bent at least partially. The D-shaped holding portion 42 is also compressed by the clamping force at least partly while simultaneously applying the clamping force on the electrically conductive flexible band 36 and the inner conductor 26 in order to ensure proper electrical connection between these components.

Generally, the spacers 54 are also used for compensating any manufacturing tolerances that may occur during the manufacturing of the microwave device 10.

The microwave device 10 is enabled to replace the inner conductor 26, e.g. the entire coaxial connector 24 easily due to the connection 34 established between the inner conductor 26 and the electrically conductive flexible band 36, which can be detached in a non-destructive manner.

Due to the electrical contact/connection established which has the defined characteristics due to the defined clamping force/pressure applied, the microwave device 10 is generally enabled to receive a signal with a frequency larger than 50 GHz. Hence, the microwave device 10 is suitable for high frequency applications.

Additionally or alternatively to the snap-in connections shown, a screwing connection may also be established. The respective openings 56 of the housing 12 and the openings 66 of the clamping component 38 may have threads, wherein the protrusions 58 or bars 64 may have corresponding threads. Thus, a screwing connection may be established.

Alternatively to the coaxial connector 24 shown at the outer surface of the housing 12, the microwave device 10 may generally comprise a connector arrangement having an inner conductor 26 which is connected to the circuit structure 28 in the non-destructive detachable manner. In other words, the connection established can be detached in a non-destructive manner.

In general, the clamping component 38 has at least one opening 66 into which a corresponding protrusion 64 is inserted when connecting the clamping component 38 with the housing 12. Alternatively or additionally, the housing 12 has at least one opening 56 into which a corresponding protrusion 76 is inserted when connecting the clamping component 38 with the housing 12.

For instance, the clamping component 38 has one protrusion 76 and one opening 66, wherein the housing 12 has one opening 56 and one protrusion 64, and wherein the protrusion 76 of the clamping component 38 corresponds to the opening 56 of the housing 12 and the protrusion 64 of the housing 12 corresponds to the opening 66 of the clamping component 38.

Generally, the respective protrusion 64, 76 may be established by the housing 12 or the clamping component 38. However, the respective protrusion 64, 76 may also be formed separately with respect to the housing 12 and the clamping component 38 while being inserted into an opening 66 of the clamping component 38 and an opening 56 of the housing 12.

Consequently, the type of connecting element, e.g. protrusion and/or opening, may be chosen accordingly. In case of using one protrusion and one opening at the clamping component 38 or the housing 12, the respective connection may be established according to the Poka-Yoke principle.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A microwave device for high frequency application, wherein the microwave device comprises a housing that encompasses a space, wherein at least one circuit structure is accommodated in the housing, wherein the at least one circuit structure comprises a substrate and at least one integrated circuit component arranged on the substrate, wherein an electrically conductive flexible band is provided that is attached to the substrate, wherein the electrically conductive flexible band is electrically connected to the at least one integrated circuit component, wherein the housing has an opening through which an inner conductor is fed so as to extend into the space encompassed by the housing, and wherein the inner conductor is electrically connected to the electrically conductive flexible band in a non-destructive detachable manner.

2. The microwave device according to claim 1, wherein the electrically conductive flexible band is at least partially bent around the inner conductor.

3. The microwave device according to claim 1, further comprising a clamping component that presses on the electrically conductive flexible band.

4. The microwave device according to claim 3, wherein the clamping component has an indentation for the inner conductor.

5. The microwave device according to claim 3, wherein the clamping component is connected to the housing by a screwing connection or a snap-in connection.

6. The microwave device according to claim 3, wherein the clamping component is made of a dielectric material.

7. The microwave device according to claim 3, wherein the clamping component comprises a main portion and a holding portion that presses on the electrically conductive flexible band, and wherein either a resilient element is arranged between the main portion and the holding portion or wherein the holding portion is established by a resilient element.

8. The microwave device according to claim 7, wherein the resilient element is configured such that a defined clamping force is applied on the electrically conductive flexible band.

9. The microwave device according to claim 3, wherein the clamping component comprises a main portion and a holding portion that is movable with respect to the main portion.

10. The microwave device according to claim 3, wherein the clamping component comprises a resilient element at a surface facing towards the electrically conductive flexible band.

11. The microwave device according to claim 10, wherein the resilient element is established by a foam material, a liquid crystal polymer (LCP) stripe, a string, a band or a D-shaped part.

12. The microwave device according to claim 3, wherein the clamping component has at least one opening into which a corresponding protrusion of the housing is inserted when connecting the clamping component with the housing; or wherein the housing has at least one opening into which a corresponding protrusion of the housing is inserted when connecting the clamping component with the housing; or wherein the clamping component has one protrusion and one opening, wherein the housing has one opening and one protrusion, and wherein the protrusion of the clamping component corresponds to the opening of the housing and the protrusion of the housing corresponds to the opening of the clamping component.

13. The microwave device according to claim 3, wherein the clamping component has two openings into which protrusions of the housing are inserted when connecting the clamping component with the housing; or wherein the clamping component has two protrusions that are inserted into openings in the housing when connecting the clamping component with the housing.

14. The microwave device according to claim 3, wherein the clamping component is made of several separately formed parts that are connected with each other for forming the clamping component.

15. The microwave device according to claim 1, wherein the microwave device comprises a lid for closing the space encompassed by the housing.

16. The microwave device according to claim 1, wherein the electrically conductive flexible band is attached to the at least one circuit structure by a soldered joint, a welded joint, a laser joint, an adhesive joint, a bonded joint or a clamped joint.

17. The microwave device according to claim 1, wherein the inner conductor is part of a coaxial connector or a connector arrangement.

18. The microwave device according to claim 17, wherein the coaxial connector or the connector arrangement is mechanically connected at an outer surface of the housing of the microwave device.

19. The microwave device according to claim 17, wherein the coaxial connector or the connector arrangement is configured to receive a signal with a frequency larger than 50 GHz.

20. The microwave device according to claim 1, wherein the at least one integrated circuit component comprises a conductor, a capacitor, a coil or a resistor.

\* \* \* \* \*